US010156601B2

(12) United States Patent
Hinotani et al.

(10) Patent No.: US 10,156,601 B2
(45) Date of Patent: Dec. 18, 2018

(54) ANTENNA MEASUREMENT SYSTEM AND ANTENNA MEASUREMENT METHOD

(71) Applicant: ANRITSU CORPORATION, Kanagawa (JP)

(72) Inventors: Aya Hinotani, Kanagawa (JP); Takashi Kawamura, Kanagawa (JP); Shigenori Mattori, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 43 days.

(21) Appl. No.: 15/594,787

(22) Filed: May 15, 2017

(65) Prior Publication Data
US 2017/0336454 A1 Nov. 23, 2017

(30) Foreign Application Priority Data

May 17, 2016 (JP) .................................. 2016-098928
Oct. 6, 2016 (JP) .................................. 2016-197861

(51) Int. Cl.
| | |
|---|---|
| *G01R 29/10* | (2006.01) |
| *H01Q 3/26* | (2006.01) |
| *H01Q 3/22* | (2006.01) |
| *H01Q 3/24* | (2006.01) |
| *H01Q 3/28* | (2006.01) |
| *H01Q 3/30* | (2006.01) |

(52) U.S. Cl.
CPC .............. *G01R 29/10* (2013.01); *H01Q 3/22* (2013.01); *H01Q 3/24* (2013.01); *H01Q 3/2605* (2013.01); *H01Q 3/267* (2013.01); *H01Q 3/28* (2013.01); *H01Q 3/30* (2013.01); *H01Q 3/26* (2013.01)

(58) Field of Classification Search
CPC ...... G01R 29/10; G01R 29/0871; H01Q 3/16; H01Q 3/28; H01Q 3/30; H01Q 3/267; H01Q 3/2605; H04B 17/12; H04B 17/102; H04B 17/104; H04B 17/0085
See application file for complete search history.

(56) References Cited

U.S. PATENT DOCUMENTS

| | | | |
|---|---|---|---|
| 6,975,111 B2 * | 12/2005 | Kazama ............ | G01R 29/0871 324/260 |
| 7,876,276 B1 * | 1/2011 | Zaman ..................... | H01Q 3/08 343/703 |

OTHER PUBLICATIONS

Ohmsha, Ltd., Antenna Engineering Handbook (2nd Edition), p. 730-733, Jul. 25, 2008.

* cited by examiner

*Primary Examiner* — Minh N Tang
(74) *Attorney, Agent, or Firm* — Pearne & Gordon LLP

(57) ABSTRACT

The system includes a plurality of probe antennas that receive radio signals at a plurality of measurement positions located within a measurement plane in a near field region of an antenna to be measured, a probe scanning mechanism that moves the respective probe antennas to a plurality of measurement positions while maintaining relative positions of the plurality of probe antennas, an amplitude and phase difference measurement unit that measures a phase difference between the radio signals and measures amplitudes of the radio signals, every time the respective probe antennas are moved to the measurement positions, and a phase calculation unit that calculates a phase of the radio signal at each measurement position from the phase difference measured by the amplitude and phase difference measurement unit.

20 Claims, 16 Drawing Sheets

--- Distribution of near field electric field phases of horn antenna
—◇— Phase difference calculation result performed by five probes

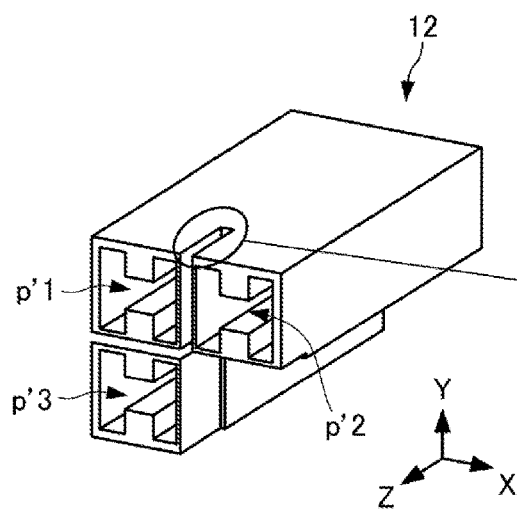 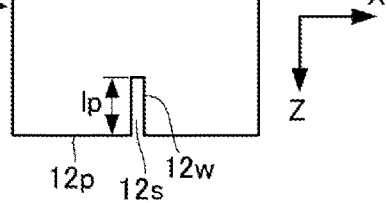
FIG.12A  FIG.12B
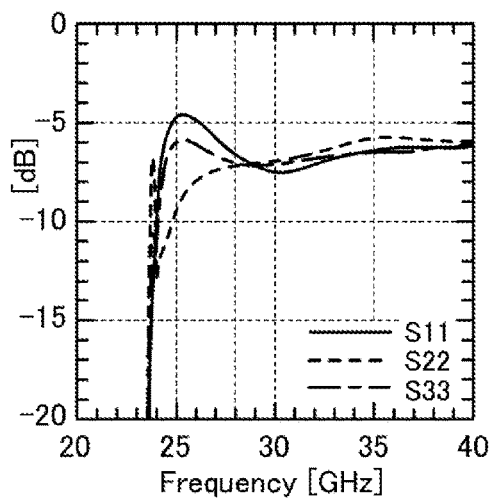 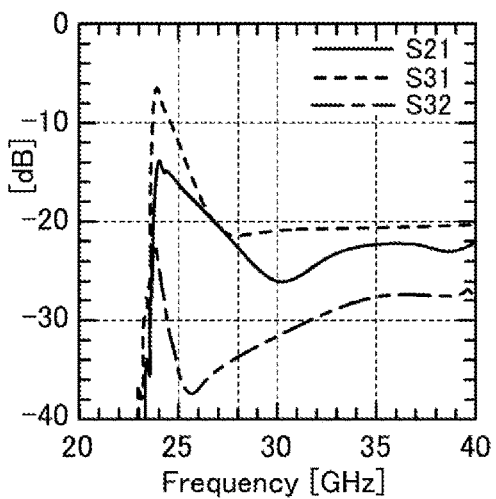
FIG.12C  FIG.12D

ANTENNA MEASUREMENT SYSTEM AND ANTENNA MEASUREMENT METHOD

TECHNICAL FIELD

The present invention relates to an antenna measurement system and an antenna measurement method, and particularly relates to an antenna measurement system and an antenna measurement method for measuring the characteristics of an antenna integrated with an RF circuit using a near field measurement.

BACKGROUND ART

Active antennas have an RF circuit integrated with each element of an antenna array, and have a feature capable of controlling the radiation direction and beam shape of electromagnetic waves to be output. Particularly, in a case where the active antennas are used in a base station of mobile communication, there is an advantage in that a coverage area can be flexibly controlled.

As a measurement of the characteristics of an antenna having a strong directivity such as an antenna which is used in such an active antenna, a near field measurement (NFM) for calculating a far field directivity from the near electromagnetic field of an antenna on the basis of an electromagnetic field theory has been known.

In the near field measurement, since an electromagnetic field is measured in the vicinity of an antenna, there is an advantage in that a loss of electromagnetic waves due to a space is small, and that not only a directivity can be measured but also an antenna can be diagnosed from the near field distribution of the antenna.

Generally, as shown in FIG. 15, among regions of an electromagnetic field which is radiated from the aperture plane of an antenna, a region adjacent to an antenna aperture is a reactive near field region (extreme near field) mainly containing electromagnetic field components that do not contribute to radiation, and a region having no change in directivity depending on a distance from the antenna aperture is called a radiation far field region (far field). The directivity of an antenna to be generally represented refers to directivity measured in this radiation far field region.

The far field is specified as a position away by more than a distance R which satisfies the following Expression (1) with respect to a maximum diameter D (aperture dimension) of an antenna. Here, λ is a free space wavelength. In addition, when a gain of a transmitting antenna is set to Gt, a gain of the receiving antenna is set to Gr, and transmission power is set to be Wt, maximum power Wa capable of being received by a receiving antenna in a free space is represented like the following Expression (2).

$$R > 2D^2/\lambda \quad (1)$$

$$Wa = (\lambda/4\pi R)^2 \cdot Gt \cdot Gr \cdot Wt \quad (2)$$

Therefore, in an antenna having a large aperture plane with a high gain, the distance R increases, and attenuation in a space increases. Further, in a millimeter-wave zone, since a free space wavelength λ decreases in size, there is a problem in that the amount of attenuation further increases, and that it is not likely to measure a low-level side lobe.

A radiation near field region (near field) which is a region located between the reactive near field region and the radiation far field region is a region having a change in directivity in accordance with a distance. In the NFM described above, an electromagnetic field is measured in this radiation near field region, and directivity in a far field is obtained by calculation.

Specifically, the vicinity of an antenna to which a predetermined signal is supplied is scanned by a probe antenna, and the distribution of amplitudes and phases for each scanning position is obtained from a signal received by the probe antenna, thereby allowing directivity at infinity to be obtained by data processing from this distribution. Since a measurement in the vicinity of an antenna is performed, the amount of attenuation in a space is small, and thus it is possible to perform a high-accuracy measurement as compared to a far field measurement.

The NFM is divided into a plurality of types depending on a range in which the vicinity of an antenna to be measured is scanned, but is advantageous to an antenna having a high gain, and a plane NFM which is easy of data processing is widely used.

FIG. 16 shows a configuration of a measurement device 10 that obtains the directivity of an antenna 100 to be measured using the plane NFM. This measurement device 10 includes an antenna support 51 that supports the antenna 100 to be measured in a state where its radiation plane is directed toward a predetermined direction, a probe antenna 52 for receiving electromagnetic waves which are output from the antenna 100 to be measured, and a probe scanning mechanism 53 that moves the probe antenna 52 in X and Y directions within a neighboring measurement plane facing the radiation plane of the antenna 100 to be measured.

In addition, the measurement device 10 includes a measurement control unit 56 that controls a signal generator 54 for assigning a measuring signal to the antenna 100 to be measured, an amplitude and phase detector 55 for detecting information of an amplitude and a phase from a received signal of the probe antenna 52, and the probe scanning mechanism 53, receives an output of the amplitude and phase detector 55 while scanning the position of the probe antenna 52 at a predetermined pitch within a measurement plane P, and obtains a far field directivity of the antenna 100 to be measured from distribution of amplitudes and phases within the measurement plane P, and a display unit 57 that displays the obtained directivity of the antenna 100 to be measured. Meanwhile, as the signal generator 54 and the amplitude and phase detector 55, a network analyzer having their functions can be used, and a personal computer can be used as the measurement control unit 56.

Here, in a case of the NFM, the probe antenna 52 scans the neighboring measurement plane P located away by approximately three wavelengths of a measurement signal from the antenna 100 to be measured, and the amplitude and phase of its electric field are detected.

The distribution of amplitudes and phases in the measurement plane P has a form of Fourier transformation of a function which is defined from the directivity of the antenna 100 to be measured and the directivity of the probe antenna 52. In the measurement control unit 56, the function is obtained by inverse Fourier transformation, and then arithmetic processing (probe correction) of removing the directivity of the probe antenna 52 is performed, thereby allowing the directivity of the antenna 100 to be measured to be obtained. In the measurement control unit 56, since data processing can be performed by fast Fourier transformation (FFT), it is possible to calculate the far field directivity of the antenna 100 to be measured at a fast rate.

It is generally known as disclosed in Non-Patent Document 1 that, as described above, the distribution of amplitudes and phase in the measurement plane P has a form of Fourier transformation of a function which is defined from the directivity of the antenna to be measured and the directivity of the probe antenna, its function is obtained by inverse Fourier transformation, and then arithmetic processing (probe correction) of removing the directivity of the probe antenna 52 is performed, thereby allowing the directivity of the antenna 100 to be measured to be obtained.

The NFM in which the directivity of the antenna is obtained in this manner has the following advantages over a far field measurement (FFM).

Since the NFM is a measurement in a short distance, a measurement can be performed even in a case where an anechoic chamber is not used, and a large-scale device is not required. In addition, since a device becomes compact in a millimeter-wave zone, a measurement in a simple anechoic chamber installed in a living room can be performed, and it is possible to drastically shorten a time spent in constructing a measurement system which is a problem in a measurement in an anechoic chamber. Further, since a measurement in a region having a small free-space loss is performed, it is possible to obtain measurement results with good accuracy.

Further, in the NFM, the distribution of amplitudes and phases in the vicinity of an antenna is obtained. Therefore, in a case where directivity as designed is not obtained, the cause can be diagnosed. This is a great advantage to a phased array antenna such as an active antenna.

RELATED ART DOCUMENT

Non-Patent Document

[Non-Patent Document 1] Antenna Engineering Handbook (Second Edition), p 730 to p 733, Published on Jul. 25, 2008 of The Institute of Electronics, Information and Communication Engineers, Ohmsha, Ltd.

DISCLOSURE OF THE INVENTION

Problem that the Invention is to Solve

However, in measurement devices of the related art that obtains a distribution of near field phases in the NFM, it is necessary to supply an antenna to be measured with a radio signal to radiate electromagnetic waves of the radio signal from the antenna to be measured, and to assign this radio signal, as a reference signal, to an amplitude and phase detector. On the other hand, a large number of active antennas have a problem in that, since an RF circuit and an antenna are integrated with each other, a terminal for inputting and outputting a signal to the antenna is not present, and that the reference signal is not able to be supplied from the RF circuit of the active antenna to the amplitude and phase detector.

The present invention is contrived in order to solve such a problem of the related art, and an object thereof is to provide an antenna measurement system and an antenna measurement method which are capable of measuring phases and amplitudes in a near field with respect to electromagnetic waves of a radio signal transmitted from an antenna to be measured which is integrated with an RF circuit, without supplying a reference signal from the antenna to be measured.

Means for Solving the Problem

In order to solve the above problem, according to an aspect of the present invention, there is provided an antenna measurement system that measures an amplitude and a phase of each radio signal transmitted from an antenna to be measured, in a near field, the system including: a plurality of probe antennas that receive the radio signals at some of a plurality of measurement positions located within a predetermined measurement plane of a near field region of the antenna to be measured; a probe scanning mechanism that moves the plurality of probe antennas to the plurality of measurement positions; an amplitude and phase difference measurement unit that measures a phase difference between the radio signals received by the plurality of probe antennas, and measures an amplitude of each of the radio signals received by the plurality of probe antennas, every time each of the probe antennas is moved to the measurement position by the probe scanning mechanism; and a phase calculation unit that calculates a phase of the radio signal at each of the measurement positions from the phase difference measured by the amplitude and phase difference measurement unit. In addition, in the antenna measurement system according to the aspect of the present invention, the antenna to be measured is configured to have an RF circuit integrated therewith, and the antenna measurement system may further include the plurality of probe antennas are moved while maintaining relative positions therebetween.

With such a configuration, it is possible to measure phases and amplitudes in a near field, without supplying a reference signal of the antenna to be measured to the radio signal transmitted from the antenna to be measured which is integrated with an RF circuit. In addition, with such a configuration, a plurality of probe antennas are scanned so as to include at least one of measurement positions at which amplitudes and phase differences have already been measured by the amplitude and phase difference measurement unit, and measurement positions at which amplitudes and phase differences have not yet been measured, and thus it is possible to calculate phases at all the measurement positions at which amplitudes and phase differences are measured.

In addition, the antenna measurement system according to the aspect of the present invention may further include a far field directivity calculation unit that calculates a distribution of far field electric field intensity, using information of the amplitude measured by the amplitude and phase difference measurement unit and information of the phase calculated by the phase calculation unit.

With such a configuration, the radio signal transmitted from the antenna to be measured which is integrated with an RF circuit is measured using a near field measurement, and thus it is possible to calculate the distribution of far field electric field intensity.

In addition, in the antenna measurement system according to the aspect of the present invention, the plurality of probe antennas may be disposed simultaneously at four or more measurement positions by the probe scanning mechanism, and be disposed so as to be line-symmetric with respect to a straight line that links any two measurement positions out of the four or more measurement positions, and the two measurement positions are adjacent to each other.

With such a configuration in which a plurality of probe antennas are symmetrically disposed, it is possible to calculate a phase by offsetting influences due to mutual coupling between the probe antennas adjacent to each other, in a process of the phase calculation unit.

In addition, in the antenna measurement system according to the aspect of the present invention, the plurality of probe antennas may include a central probe antenna, a left probe antenna and a right probe antenna which are symmetrically disposed in a horizontal direction of the measurement plane, centering on the central probe antenna, and an upper probe antenna and a lower probe antenna which are symmetrically disposed in a vertical direction of the measurement plane, centering on the central probe antenna, and the phase calculation unit may include a phase difference averaging unit that averages a plurality of phase differences measured by the amplitude and phase difference measurement unit at two measurement positions adjacent to each other, and calculates a phase of the radio signal at each of the measurement positions from the phase difference averaged by the phase difference averaging unit.

With such a configuration, the phase difference between the radio signals received by the central probe antenna and the left probe antenna and the phase difference between the radio signals received by the central probe antenna and the right probe antenna are averaged in two measurement positions adjacent to each other, and thus it is possible to calculate phases by offsetting errors because a measurement error of the phase difference between the central probe antenna and the left probe antenna and a measurement error of the phase difference between the central probe antenna and the right probe antenna have reverse polarities, and to obtain the distribution of phases with a higher degree of accuracy. In addition, the same phase averaging is also performed on the upper probe antenna and the lower probe antenna, and thus it is possible to obtain the distribution of phases with a high degree of accuracy.

In addition, in the antenna measurement system according to the aspect of the present invention, at least one of the plurality of probe antennas may be a double-ridge waveguide which includes a transmission line for propagating electromagnetic waves of a predetermined frequency range, and in which a cross-sectional shape of the transmission line is configured such that a central portion thereof is smaller in height than both side portions thereof.

It is possible to propagate electromagnetic waves of an equal frequency range in a cross-sectional shape smaller than the cross-sectional shape of the transmission line of a standard square waveguide by using the double-ridge waveguide as described above, and thus it is easy to adjacent dispose the plurality of probe antennas at a distance equal to or less than ½ wavelength (0.5λ) of the radio signal.

In addition, in the antenna measurement system according to the aspect of the present invention, at least two of the plurality of probe antennas which are adjacent to each other may be the double-ridge waveguide, and a wall portion that partitions the two double-ridge waveguides adjacent to each other may be provided with a slit having a predetermined length from an aperture plane side of the double-ridge waveguide along a longitudinal direction of the transmission line.

With such a configuration, the wall portion that partitions two double-ridge waveguides adjacent to each other is provided with the slit, and thus an isolation between the two double-ridge waveguides adjacent to each other is improved, that is, coupling therebetween is reduced. In addition, reflection in each double-ridge waveguide aperture is reduced, and the receiving sensitivity thereof is improved.

In addition, in the antenna measurement system according to the aspect of the present invention, aperture shapes of the plurality of probe antennas may be the same as each other.

With such a configuration, the receiving sensitivities of the respective probe antennas are equal to each other, and thus it is easy to average the amplitudes.

In addition, the antenna measurement system according to the aspect of the present invention may further include an antenna support that supports the antenna to be measured, the antenna support may be configured such that a direction in which an electromagnetic wave radiation plane of the antenna to be measured directly faces the measurement plane is a reference direction, and that a direction of the electromagnetic wave radiation plane is capable of being changed from the reference direction.

With such a configuration, even in a case where a beam direction when the antenna to be measured is directed toward the reference direction is away from the center of the measurement plane, it is possible to obtain a directivity in the measurement plane having a minimum size by rotating the antenna to be measured.

In addition, according to another aspect of the present invention, there is provided an antenna measurement method using the antenna measurement system according to any one of the aspects, the method including: a probe scanning step of moving each of the probe antennas to each of a plurality of measurement positions; an amplitude and phase difference measuring step of measuring a phase difference between the radio signals received by the plurality of probe antennas, and measuring an amplitude of each of the radio signals received by the plurality of probe antennas, every time each of the probe antennas is scanned at the measurement position; and a phase calculation step of calculating a phase of the radio signal at each of the measurement positions from the phase difference measured in the amplitude and phase difference measuring step.

With such a configuration, it is possible to measure phases and amplitudes in a near field, without supplying a reference signal of the antenna to be measured to the radio signal transmitted from the antenna to be measured which is integrated with an RF circuit. In addition, with such a configuration, a plurality of probe antennas are scanned so as to include at least one of measurement positions at which amplitudes and phase differences have already been measured by the amplitude and phase difference measurement unit, and measurement positions at which amplitudes and phase differences have not yet been measured, and thus it is possible to calculate phases at all the measurement positions at which amplitudes and phase differences are measured.

Advantage of the Invention

The present invention provides an antenna measurement system and an antenna measurement method which are capable of measuring phases and amplitudes in a near field with respect to electromagnetic waves of a radio signal transmitted from an antenna to be measured which is integrated with an RF circuit, without supplying a reference signal from the antenna to be measured.

BRIEF DESCRIPTION OF THE DRAWINGS

FIGS. 12A to 12D are graphs (second parts) illustrating simulation results of the reflection characteristics and isolations of the horn antenna which are performed by the antenna measurement system according to the first embodiment.

BEST MODE FOR CARRYING OUT THE INVENTION

Hereinafter, embodiments of an antenna measurement system and an antenna measurement method according to the present invention will be described with reference the accompanying drawings.

First Embodiment

Figure 1:
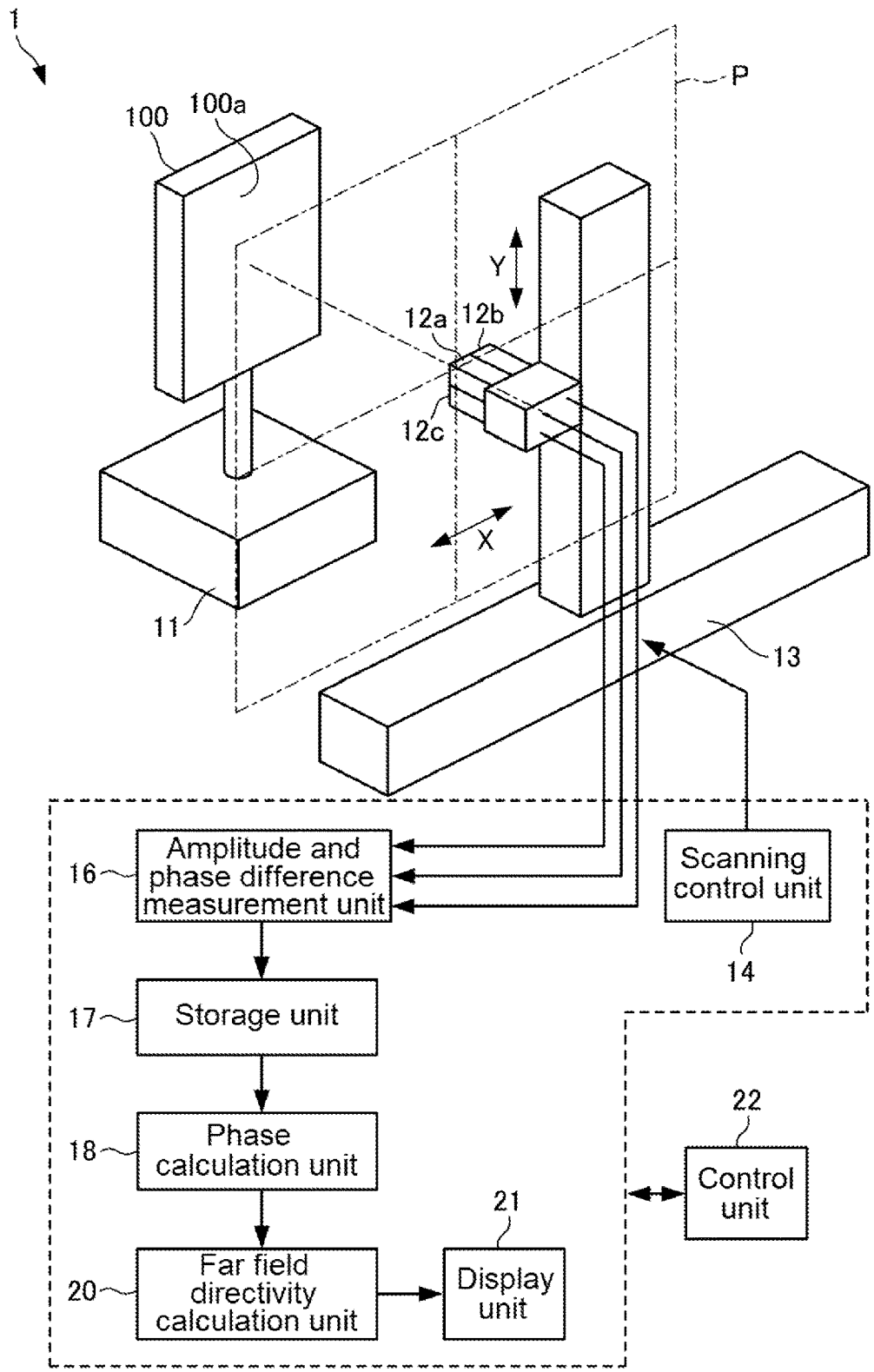
FIG. 1 is a configuration diagram of an antenna measurement system according to a first embodiment.

As shown in FIG. 1, an antenna measurement system 1 according to a first embodiment of the present invention measures an amplitude and a phase of a radio signal transmitted from an antenna 100 to be measured, in a near field, and calculates the distribution of electric field intensity in a far field.

The antenna 100 to be measured is, for example, an active antenna which is configured to have an RF function (RF circuit) integrated with a plurality of antenna elements. As the radio signal transmitted from the antenna 100 to be measured during the measurement of the distribution of electric field intensity which is performed by the antenna measurement system 1, a non-modulated wave signal, a multicarrier signal (for example, OFDM signal), or the like can be used.

The antenna measurement system 1 includes an antenna support 11, a plurality of probe antennas 12, a probe scanning mechanism 13, a scanning control unit 14, an amplitude and phase difference measurement unit 16, a storage unit 17, a phase calculation unit 18, a far field directivity calculation unit 20, a display unit 21, and a control unit 22. In FIG. 1, as an example, a case is shown in which the number of plurality of probe antennas 12 is three.

The antenna support 11 is configured to support the antenna 100 to be measured in a state where an electromagnetic wave radiation plane 100a thereof is directed toward a predetermined direction.

Each of the probe antennas 12a to 12c is configured to receive electromagnetic waves of the radio signal which is output from the antenna 100 to be measured, at a plurality of measurement positions located within a predetermined measurement plane P in a near field region of the antenna 100 to be measured. All of the plurality of probe antennas 12 may be the same as each other, and may be different from each other. Meanwhile, in a case where all the aperture shapes of the probe antennas 12 are formed to be the same as each other, there is an advantages in that the receiving sensitivity of the respective probe antennas become the same as each other, and that amplitude averaging is facilitated in an amplitude averaging unit 19 described later.

For example, at least one of the plurality of probe antennas 12 may be a waveguide which includes a transmission line for propagating electromagnetic waves of a predetermined frequency range having a micro-wave or millimeter-wave zone, and of which the tip is opened. An example of such a waveguide capable of being used includes a square waveguide in which the cross-sectional shape of the transmission line is rectangular, or a double-ridge waveguide in which the cross-sectional shape of the transmission line is configured such that the height of a central portion is smaller than the heights of both side portions.

Figure 2A:
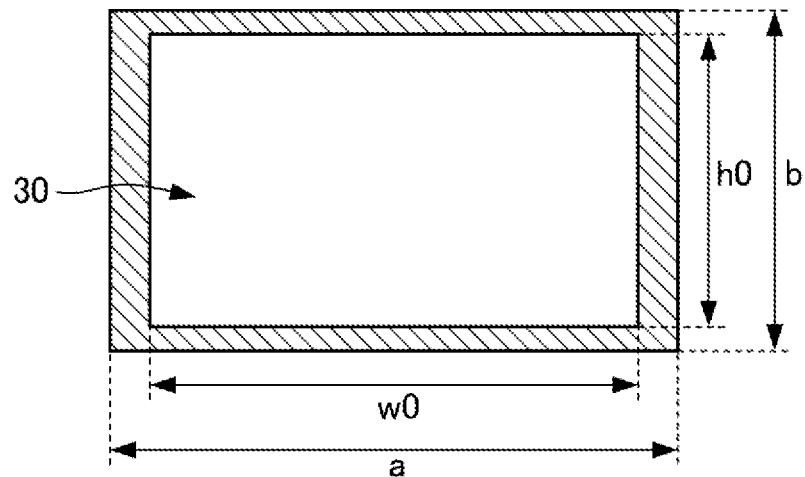
FIGS. 2A and 2B are cross-sectional views illustrating a configuration of a probe antenna included in the antenna measurement system according to the first embodiment.

FIG. 2A is a diagram illustrating a cross-section perpendicular to the longitudinal direction of a transmission line 30 of a square waveguide which is used as the probe antenna 12. The outward shape axb of the square waveguide is larger than the inside diameter wOxhO thereof, and is arbitrary in a range in which strength as a structure is obtained.

Figure 2B:
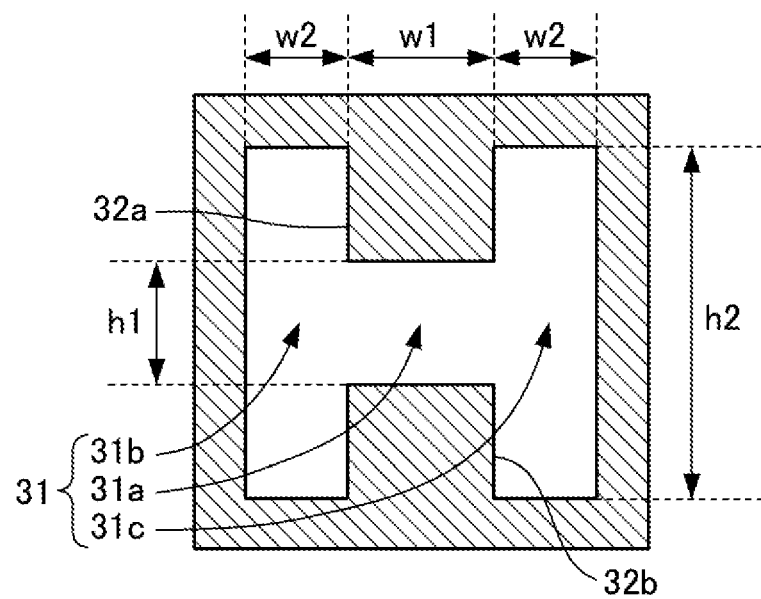

FIG. 2B is a diagram illustrating a cross-section perpendicular to the longitudinal direction of a transmission line 31 of the double-ridge waveguide which is used as the probe antenna 12. In the double-ridge waveguide, two protruding portions 32a and 32b protruding from the centers of upper and lower inner walls in directions close to each other are continuously formed in a longitudinal direction. That is, the height h1 of a central portion 31a of the transmission line 31 is set to be smaller than the height h2 of both side portions 31b and 31c thereof.

In a case of this double-ridge waveguide, there is an advantages in that electromagnetic waves of an equal frequency range are able to be propagated in a cross-sectional shape smaller than the cross-sectional shape of a transmission line of a standard square waveguide by adjusting the width w1 and height h1 of the central portion 31a and the width w2 and height h2 of both side portions 31b and 31c. In addition, in a case where the width and height of the double-ridge waveguide are set to have the same dimension, there is an advantages in that its aperture widens and its receiving sensitivity increases.

Figure 3A:
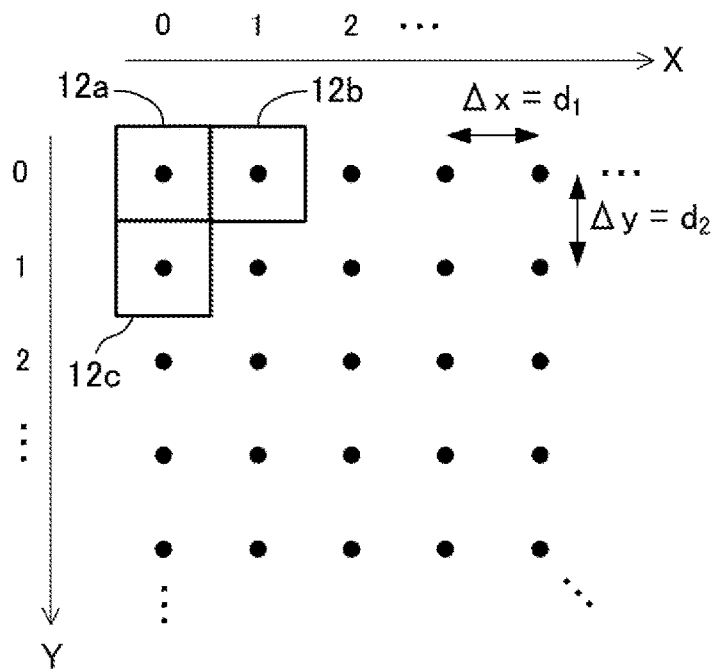
FIGS. 3A and 3B are schematic diagrams illustrating the arrangement and measurement positions of a plurality of probe antennas included in the antenna measurement system according to the first embodiment.
Figure 3B:
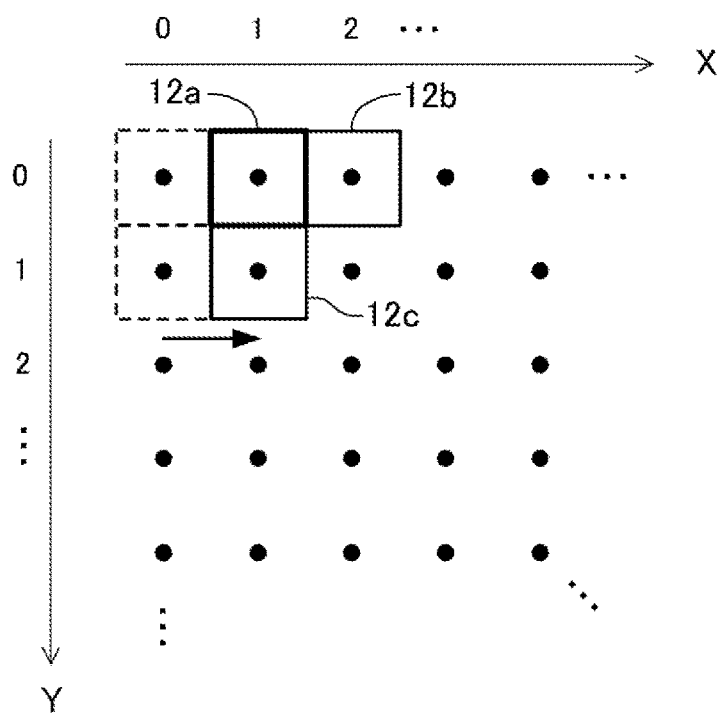

FIGS. 3A and 3B are schematic diagrams illustrating measurement positions (● marks in the drawing) within the measurement plane P and the arrangement of the plurality of probe antennas 12. As shown in FIGS. 3A and 3B, the measurement positions can be represented as lattice points in a case where the measurement plane P is divided into Δx in an X direction and Δy in a Y direction in a lattice shape. In FIGS. 3A and 3B, as an example, a case of Δx=$d_1$ and Δy=$d_2$ is shown. Herein, distances $d_1$ and $d_2$ are set to values equal to or less than ½ of a wavelength λ of the radio signal. Meanwhile, a relation of $d_1$=$d_2$ can also be established.

As shown in FIGS. 3A and 3B or the like, the plurality of probe antennas 12 are disposed simultaneously at three or more measurement positions by the probe scanning mechanism 13. For example, at the distances $d_1$ and $d_2$ from one probe antenna 12a, the remaining two probe antennas 12b and 12c are disposed in the X direction and the Y direction.

The probe scanning mechanism 13 moves the plurality of probe antennas 12 in the X and Y directions within the neighboring measurement plane P facing the electromagnetic wave radiation plane 100a of the antenna 100 to be measured. In this case, the probe scanning mechanism 13 is configured to move the respective probe antennas 12 at a plurality of measurement positions within the measurement plane P while maintaining relative positions of the plurality of probe antennas 12.

The scanning control unit 14 is configured to perform control for causing the probe scanning mechanism 13 to move the plurality of probe antennas 12 to all the measurement positions (lattice points) within the measurement plane P in a predetermined order. For example, these measurement positions are located at positions corresponding to respective lattice points of a square lattice on the measurement plane P. In addition, the scanning control unit 14 is configured to send out coordinate information of a measurement position at which each probe antenna 12 is present to the far field directivity calculation unit 20.

The amplitude and phase difference measurement unit is configured to measure a phase difference between radio signals (hereinafter, also referred to as "received signals") received in the plurality of probe antennas 12, every time each probe antenna 12 is scanned at the measurement position by the probe scanning mechanism 13. Meanwhile, in a case where the number of inputs of the amplitude and phase difference measurement unit 16 is only two, the amplitude and phase difference measurement unit measures a phase difference between radio signals received by two of the plurality of probe antennas 12, selected by a changeover switch 15 described later, which are adjacent to each other. In addition, the amplitude and phase difference measurement unit 16 is configured to measure the amplitudes of the radio signals received by the plurality of probe antennas 12. Thereby, the distribution of amplitude and phase differences within the measurement plane P is obtained. Meanwhile, the amplitude and phase difference measurement unit 16 is constituted by a vector network analyzer, a spectrum analyzer, an oscilloscope, or the like.

The storage unit 17 is configured to store values of phase differences and amplitudes measured by the amplitude and phase difference measurement unit 16 in association with the measurement positions.

Hereinafter, a specific example of a process of the amplitude and phase difference measurement unit 16 will be described. As shown in FIG. 3A, in an initial state, it is assumed that the probe antenna 12a is located at coordinates (0, 0), the probe antenna 12b is located at coordinates (1, 0), and the probe antenna 12c is located at coordinates (0, 1).

First, the amplitude and phase difference measurement unit 16 measures a phase difference $\Delta Ph_{(0, 0)(1, 0)}$ between the received signal from the probe antenna 12a and the received signal from the probe antenna 12b. In addition, the amplitude and phase difference measurement unit 16 measures a phase difference $\Delta Ph_{(0, 0)(0, 1)}$ between the received signal from the probe antenna 12a and the received signal from the probe antenna 12c. Further, the amplitude and phase difference measurement unit 16 measures an amplitude A (0, 0) of the received signal from the probe antenna 12a, an amplitude A (1, 0) of the received signal from the probe antenna 12b, and an amplitude A (0, 1) of the received signal from the probe antenna 12c.

Next, a plurality of probe antennas are scanned by the probe scanning mechanism 13 so as to include at least one of measurement positions at which phase differences and amplitudes have already been measured, and measurement positions at which phase differences and amplitudes have not yet been measured. For example, as shown in FIG. 3B, the probe antenna 12a is moved to coordinates (1, 0), the probe antenna 12b is moved to coordinates (2, 0), and the probe antenna 12c is moved to coordinates (1, 1). As for coordinates (1, 0), the phase difference has already been measured.

Next, the amplitude and phase difference measurement unit 16 measures a phase difference $\Delta Ph_{(1, 0)(2, 0)}$ between the received signal from the probe antenna 12a and the received signal from the probe antenna 12b. In addition, the amplitude and phase difference measurement unit 16 measures a phase difference $\Delta Ph_{(1, 0)(1, 1)}$ between the received signal from the probe antenna 12a and the received signal from the probe antenna 12c. Further, the amplitude and phase difference measurement unit 16 measures an amplitude A (1, 0) of the received signal from the probe antenna 12a, an amplitude A (2, 0) of the received signal from the probe antenna 12b, and an amplitude A (1, 1) of the received signal from the probe antenna 12c.

Hereinafter, the same process is repeated while scanning the plurality of probe antennas 12 in the X direction or the Y direction. In this manner, a two-dimensional scanning is performed at the distances $d_1$ and $d_2$ within the predetermined measurement plane P, and thus amplitudes at the respective measurement positions and phase differences between measurement positions adjacent to each other can all be measured. Meanwhile, as long as the phase differences are measured with respect to all the measurement positions, the order of scanning performed by the probe scanning mechanism 13 is arbitrary.

The phase calculation unit 18 calculates a phase Ph of the radio signal at each measurement position from the phase difference measured at each measurement position by the amplitude and phase difference measurement unit 16. Further, the phase calculation unit 18 is configured to output the calculated phase at each measurement position, as phase information, to the far field directivity calculation unit 20.

Figure 4:
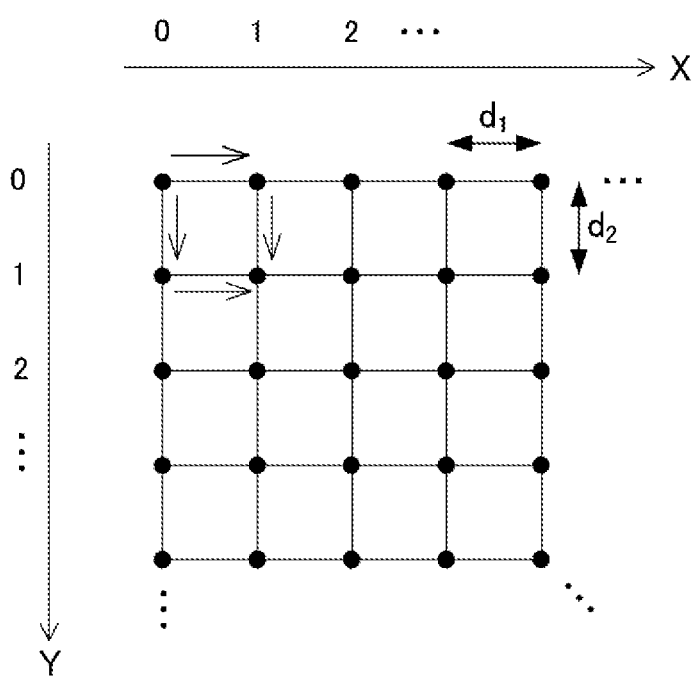
FIG. 4 is a schematic diagram illustrating a process performed by a phase calculation unit of the antenna measurement system according to the first embodiment.

For example, in the example of FIG. 4, in a case where a phase Ph(0, 0) of coordinates (0, 0) is set to an arbitrary constant, a phase Ph(1, 1) at coordinates (1, 1) is obtained by the following Expression (3) or Expression (4).

$$Ph(1,1)=Ph(0,0)+\Delta Ph_{(0,0)(1,0)}+\Delta Ph_{(1,0)(1,1)} \quad (3)$$

$$Ph(1,1)=Ph(0,0)+\Delta Ph_{(0,0)(0,1)}+\Delta Ph_{(0,1)(1,1)} \quad (4)$$

In this manner, in a case where n and m are set to a natural number, a phase Ph(n, m) at coordinates (n, m) can be calculated by cumulatively adding a phase difference obtained at a measurement position on an arbitrary path in which, for example, a starting point is set to (0, 0) and an ending point is set to (n, m). Alternatively, the phase Ph(n, m) may be calculated by taking an average of phases obtained on a plurality of paths.

The far field directivity calculation unit 20 is configured to calculate the distribution of far field electric field intensity, using coordinate information of each probe antenna 12 output from the scanning control unit 14, amplitude information measured by the amplitude and phase difference measurement unit 16, and phase information calculated by the phase calculation unit 18. Herein, the distribution of far field electric field intensity is estimated by performing the numerical calculation of a known near field/far field conversion method, and thus it is possible to obtain a directivity of the antenna 100 to be measured in a far field.

The display unit 21 is constituted by a display device such as, for example, an LCD or a CRT, and is configured to display various types of display contents in accordance with a control signal from the control unit 22. The display contents include measurement results of the phase and amplitude of the antenna 100 to be measured in a near field, calculation results of the directivity of the antenna 100 to be measured in a far field, or the like.

The control unit 22 is constituted by, for example, a microcomputer, a personal computer or the like including a CPU, and a ROM, a RAM, a HDD or the like constituting the storage unit 17, and controls an operation of each of the units constituting the antenna measurement system 1. Further, the control unit 22 is configured to constitute the amplitude and phase difference measurement unit 16, the phase calculation unit 18, and the far field directivity calculation unit 20 in a software manner by executing a predetermined program.

Meanwhile, the plurality of probe antennas 12 are disposed so that all the central positions of respective apertures are not lined up on a straight line within the measurement plane P. Thereby, a plurality of probe antennas can be scanned so as to include at least one of measurement positions at which phase differences and amplitudes have already been measured, and measurement positions at which phase differences and amplitudes have not yet been measured.

Figure 5A:
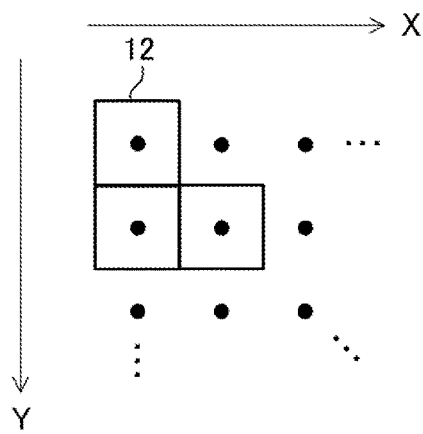
FIGS. 5A to 5D are schematic diagrams illustrating another arrangement example of a plurality of probe antennas included in the antenna measurement system according to the first embodiment.
Figure 5B:
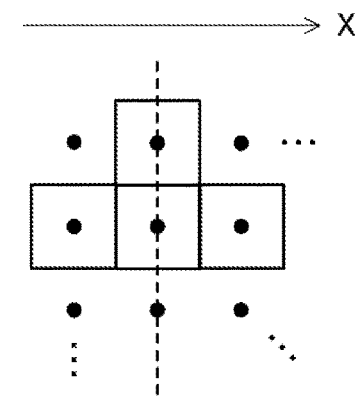
Figure 5C:
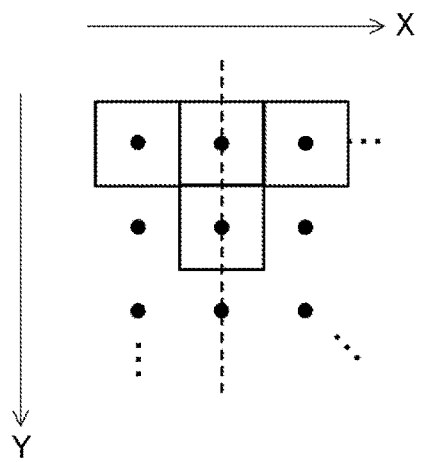
Figure 5D:
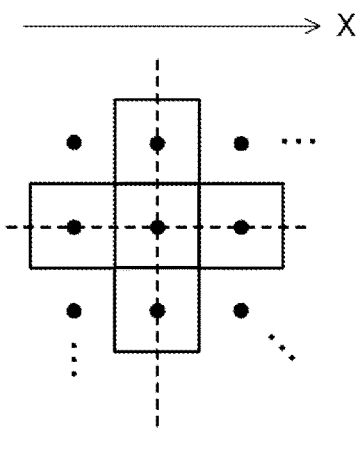

Specifically, arrangements as shown in FIGS. 5A to 5D can be used in addition to the arrangements shown in FIGS. 3A and 3B. Particularly, FIGS. 5B to 5D show a state where the plurality of probe antennas 12 are disposed so as to be line-symmetric with respect to a straight line that links any two measurement positions adjacent to each other among four or more measurement positions at which the probe antennas 12 are disposed. Meanwhile, broken lines in the drawing indicate axes of symmetry. With such a configuration, in the process of the phase calculation unit 18 (or the amplitude averaging unit 19 described later), it is possible to expect an effect or the like of offsetting influences due to mutual coupling between the probe antennas 12 adjacent to each other.

Figure 6A:
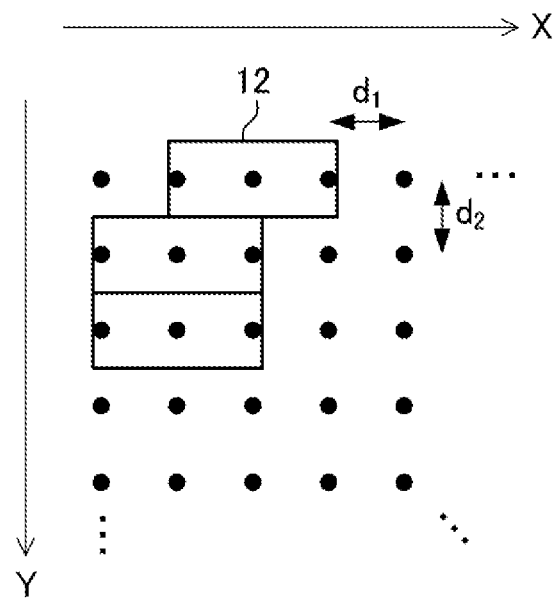
FIGS. 6A and 6B are schematic diagrams illustrating still another arrangement example of a plurality of probe antennas included in the antenna measurement system according to the first embodiment.
Figure 6B:
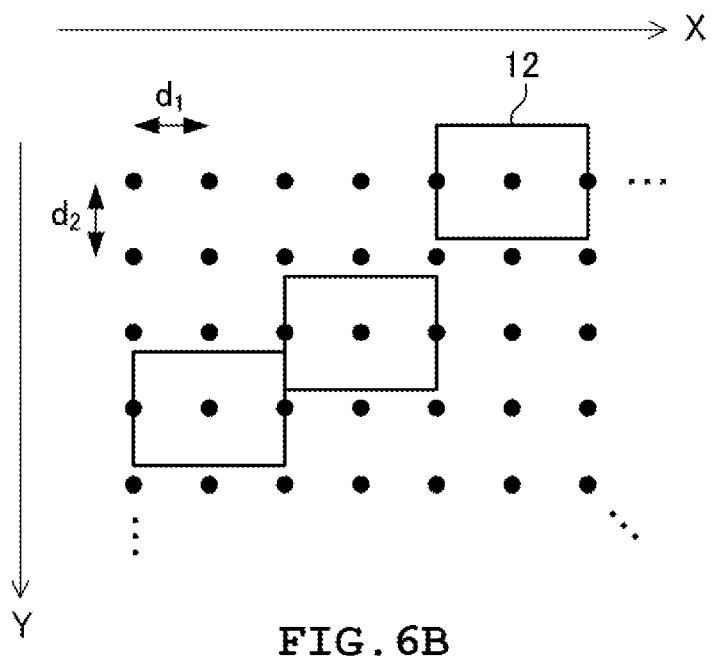

Meanwhile, in the antenna measurement system 1 of the present embodiment, in order to obtain the distribution of near field phases without a reference signal from the antenna 100 to be measured, it is necessary to measure a phase difference between lattice points of the distances $d_1$ and $d_2$ equal to or less than ½ wavelength (0.5λ) of a radio signal. However, it may be difficult to adjacently dispose probe antennas at a distance equal to or less than ½ wavelength, depending on the shape of a probe antenna. For example, in a case where the probe antenna 12 is a standard waveguide as shown in FIG. 2A, its width is normally larger than 0.5λ, and thus it is not possible to adjacently dispose the plurality of probe antennas 12 in a width direction. In such a case, for example, as shown in FIGS. 6A and 6B, the plurality of probe antennas 12 may be disposed while being appropriately shifted from the adjacent disposition thereof so that a measurement position is included in the central position of the aperture of each probe antenna 12.

Figure 7:
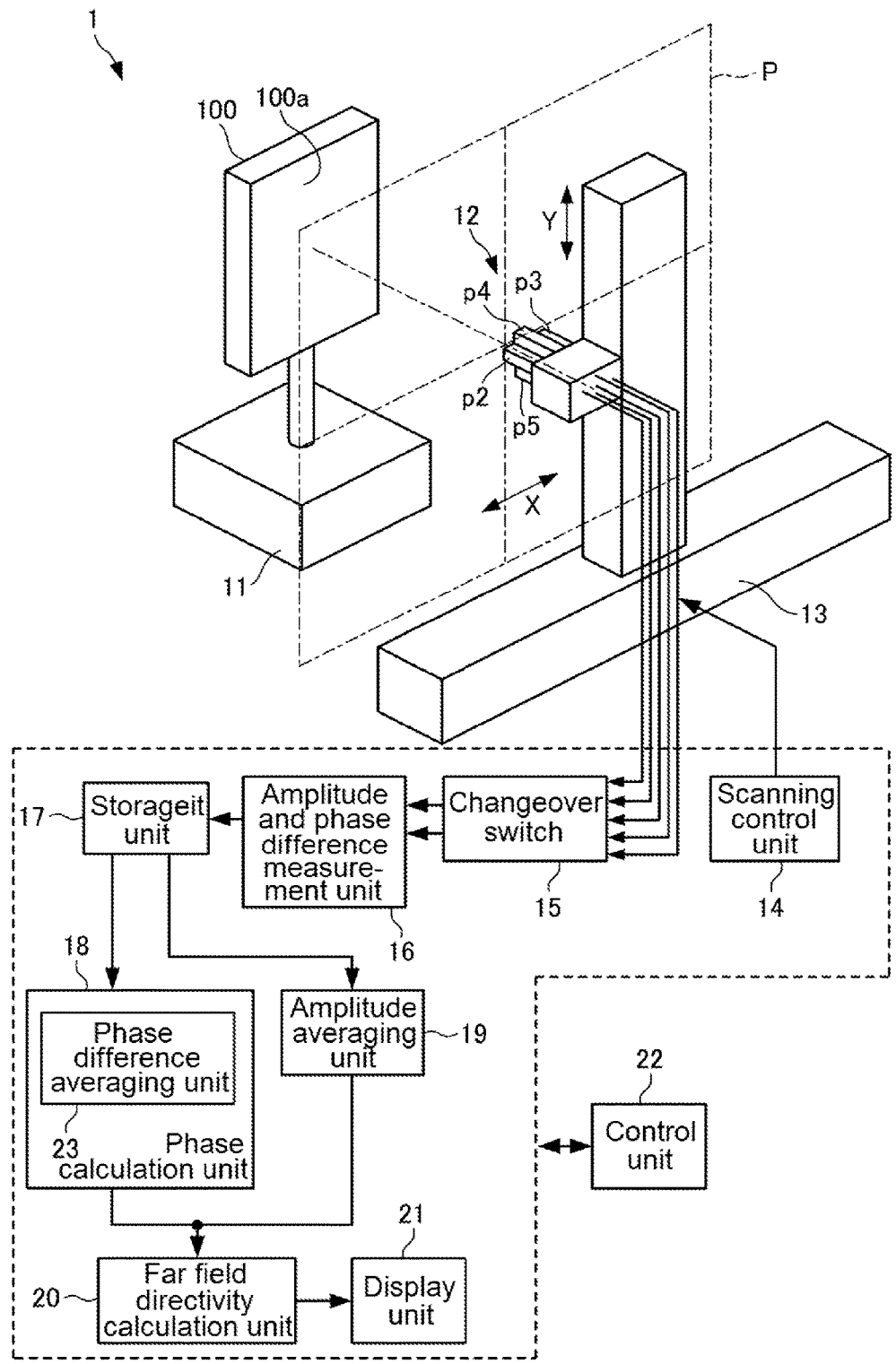
FIG. 7 is another configuration diagram of the antenna measurement system according to the first embodiment.

As already described, in a case where the number of input ports of a measuring device constituting the amplitude and phase difference measurement unit 16 is only two, the antenna measurement system 1 may include the changeover switch 15, as shown in FIG. 7. The changeover switch 15 is configured to selectively input the received signals from two probe antennas 12 adjacent to each other among the plurality of probe antennas 12 to the amplitude and phase difference measurement unit 16. In addition, the changeover switch 15 is configured to be able to sequentially switch a combination of two probe antennas 12. For example, in a case where the plurality of probe antennas 12 have the configuration shown in FIGS. 3A and 3B, the received signals from the probe antenna 12a and 12b and the received signals from the probe antenna 12a and 12c are sequentially switched, and may be input to the amplitude and phase difference measurement unit 16. Further, the received signals from the probe antenna 12b and 12c may be input to the amplitude and phase difference measurement unit 16.

In the examples shown in FIGS. 7 and 8, the plurality of probe antennas 12 includes a central probe antenna p1, a left probe antenna p2 and a right probe antenna p3 which are symmetrically disposed in the horizontal direction (X direction) of the measurement plane P centering on the central probe antenna p1, and an upper probe antenna p4 and a lower probe antenna p5 which are symmetrically disposed in the vertical direction (Y direction) of the measurement plane P centering on the central probe antenna p1.

That is, received signals from the central probe antenna p1 and the left probe antenna p2, received signals from the central probe antenna p1 and the right probe antenna p3, received signals from the central probe antenna p1 and the upper probe antenna p4, and received signals from the central probe antenna p1 and the lower probe antenna p5 are input to the amplitude and phase difference measurement unit 16. These received signals are sequentially switched by using the changeover switch 15, and may be input to the amplitude and phase difference measurement unit 16.

In addition, as shown in FIG. 7, the phase calculation unit 18 may include a phase difference averaging unit 23 that averages a plurality of phase differences measured by the amplitude and phase difference measurement unit 16 at two measurement positions adjacent to each other. In this case, the phase calculation unit 18 calculates the phase of a radio signal at each measurement position from the phase difference averaged by the phase difference averaging unit 23.

In addition, as shown in FIG. 7, the antenna measurement system 1 may include an amplitude averaging unit 19 that outputs a value obtained by averaging the plurality of amplitudes measured at the respective measurement positions by the amplitude and phase difference measurement unit 16, as amplitude information, to the far field directivity calculation unit 20. The amplitude averaging unit 19 is constituted in a software manner by the control unit 22 executing a predetermined program. The antenna measurement system 1 includes this amplitude averaging unit 19, and thus it is possible to calculate the value of an amplitude with a higher degree of accuracy.

Figure 8A:
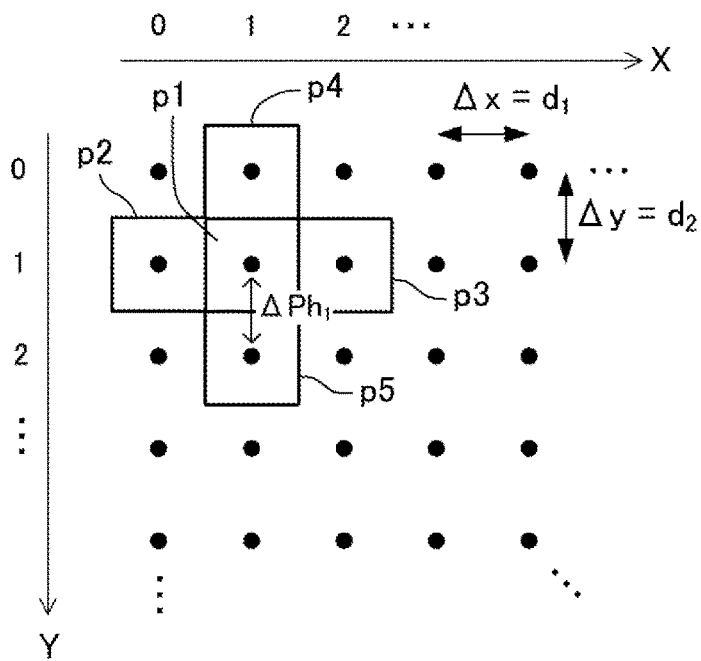
FIGS. 8A and 8B are schematic diagrams illustrating the arrangement and measurement positions of a plurality of probe antennas in the configuration of FIG. 7.

Hereinafter, a specific example of a process of the phase difference averaging unit 23 will be described. For example, as shown in FIG. 8A, the plurality of probe antennas 12 are moved by the probe scanning mechanism 13 so that the central probe antenna p1 is disposed at coordinates (1, 1). In this state, a phase difference $\Delta Ph_1$ between the received signal from the central probe antenna p1 and the received signal from the lower probe antenna p5 is measured by the amplitude and phase difference measurement unit 16, with respect to coordinates (1, 1) and coordinates (1, 2).

Figure 8B:
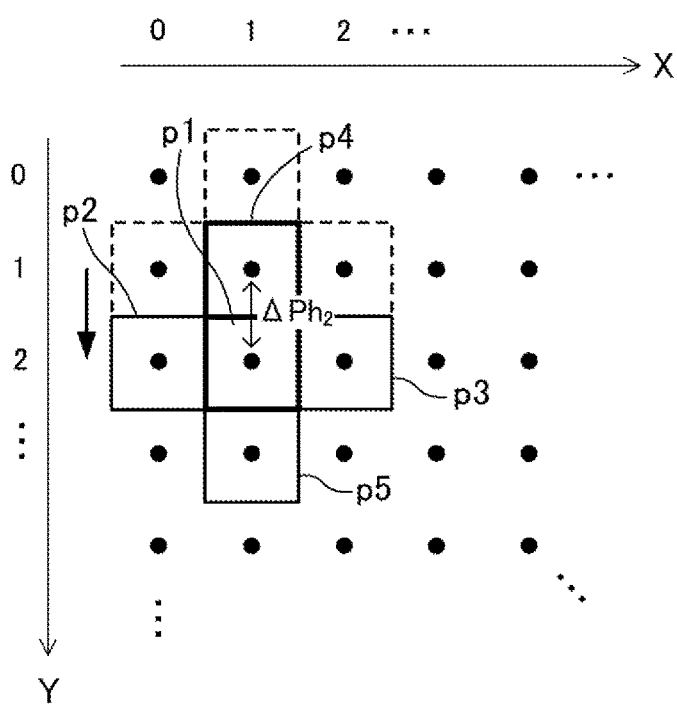

Next, for example, as shown in FIG. 8B, the plurality of probe antennas 12 are moved by Δy in the Y direction by the probe scanning mechanism 13. As described above, as for coordinates (1, 1) and coordinates (1, 2), the phase difference has already been measured. In this state, a phase difference $\Delta Ph_2$ between the received signal from the probe antenna p4 and the received signal from the probe antenna p1 is measured by the amplitude and phase difference measurement unit 16, with respect to coordinates (1, 1) and coordinates (1, 2).

The phase difference averaging unit 23 calculates a value obtained by averaging $\Delta Ph_1$ and $\Delta Ph_2$ as a phase difference $\Delta Ph_{(1, 1)(1, 2)}$, as represented in the following Expression (5).

$$\Delta Ph_{(1,1)(1,2)} = (\Delta Ph_1 + \Delta Ph_2)/2 \quad (5)$$

Similarly, the phase difference averaging unit 23 is configured to average two phase differences measured by the amplitude and phase difference measurement unit 16 at two measurement positions adjacent to each other in the X direction, with respect to the left probe antenna p2 and the right probe antenna p3.

FIGS. 9A to 10B are graphs illustrating simulation results of the distribution of near field phases in the Y direction in a case where a horn antenna is used as the antenna 100 to be measured.

Figure 9A:
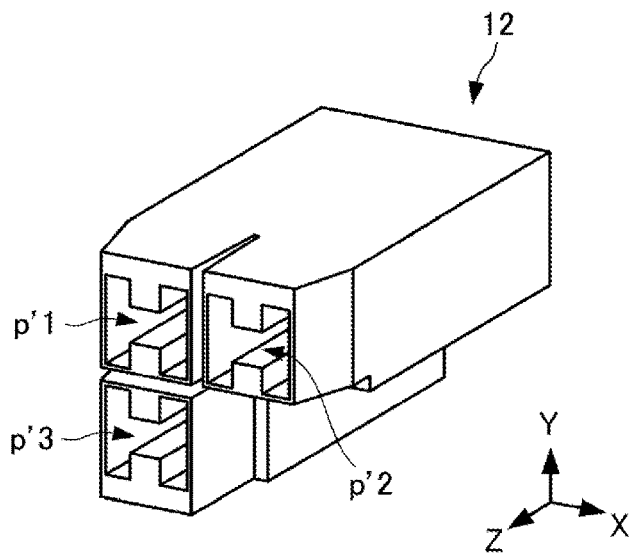
FIGS. 9A and 9B are graphs (first parts) illustrating simulation results of a distribution of near field phases of a horn antenna which are performed by the antenna measurement system according to the first embodiment.
Figure 9B:
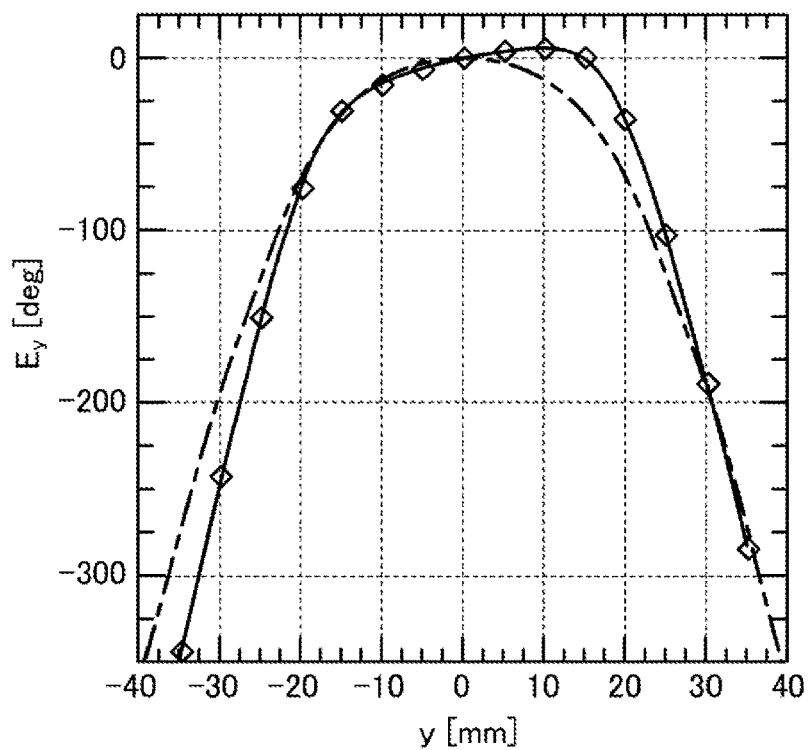

In a case where the plurality of probe antennas 12 are constituted by three probe antennas p'1, p'2, and p'3 as shown in FIG. 9A, 0 marks in FIG. 9B show the distribution of near field phases which is obtained by the probe antennas p'1 and p'3. In addition, a dashed-dotted line in FIG. 9B shows the distribution of near field phases of the horn antenna.

Figure 10A:
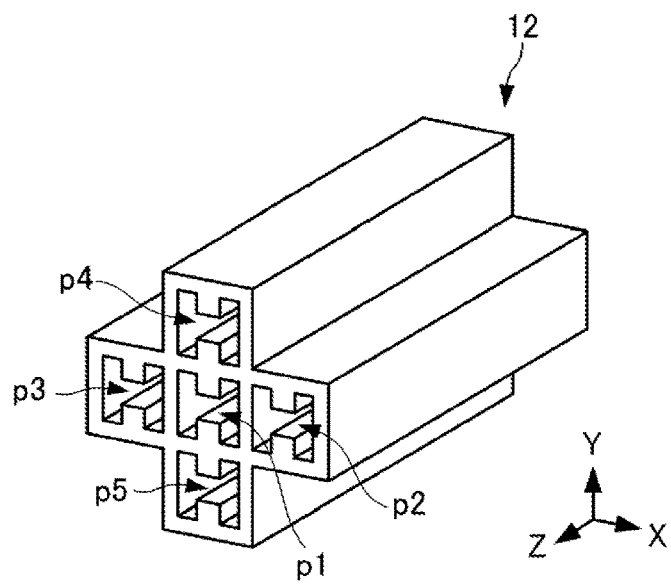
FIGS. 10A and 10B are graphs (second parts) illustrating simulation results of a distribution of near field phases of the horn antenna which are performed by the antenna measurement system according to the first embodiment.
Figure 10B:
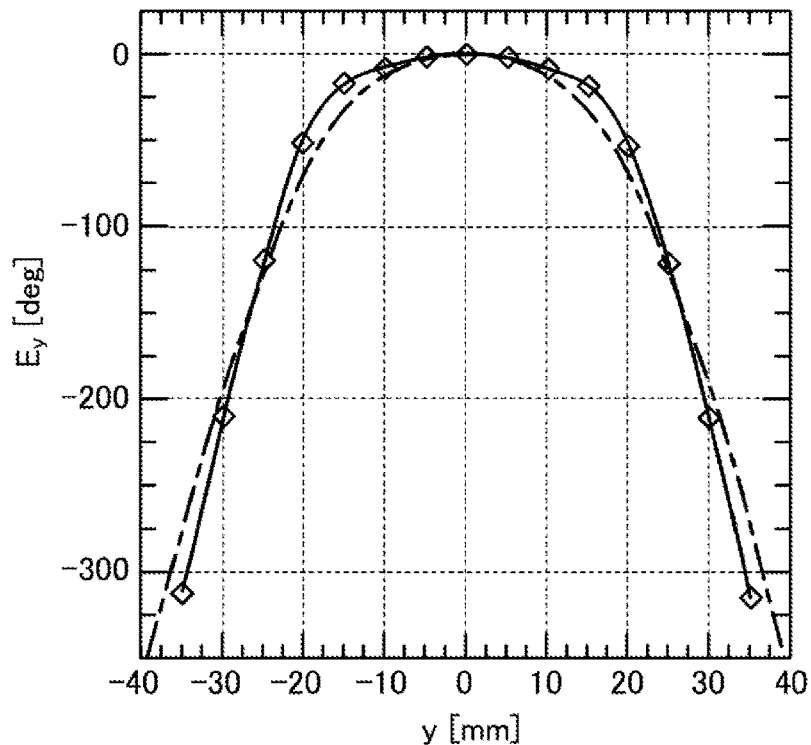

In addition, ◊ marks in FIGS. 10A and 10B show the distribution of near field phases which is obtained in a case where the plurality of probe antennas 12 are constituted by five probe antennas p1 to p5, as shown in FIG. 10A. Herein, the phase difference obtained by the probe antenna p1 and p4 and the phase difference obtained by the probe antenna p1 and p5 are averaged by the phase difference averaging unit 23, and the distribution of phases based on the averaged phase difference is obtained. In addition, a dashed-dotted line in FIG. 10B shows the distribution of near field phases of the horn antenna.

According to the results of FIGS. 9A and 9B, the distribution of phases in a case where the number of probe antennas 12 is three becomes asymmetric with respect to the central position (y=0 mm) of the horn antenna in a height direction, and an error from the distribution of asymmetric phases of the original horn antenna is exhibited. On the other hand, according to the results of FIGS. 10A and 10B, in the distribution of phases in a case where the number of probe antennas 12 is five, it can be understood that the error is drastically reduced, and that its asymmetry is improved.

FIGS. 11 and 12 are graphs illustrating results obtained by performing a simulation of reflection characteristics and isolations with respect to a configuration in which the antenna 100 to be measured is a horn antenna, and the plurality of probe antennas 12 is constituted by three double-ridge waveguides p'1 to p'3.

Figure 11A:
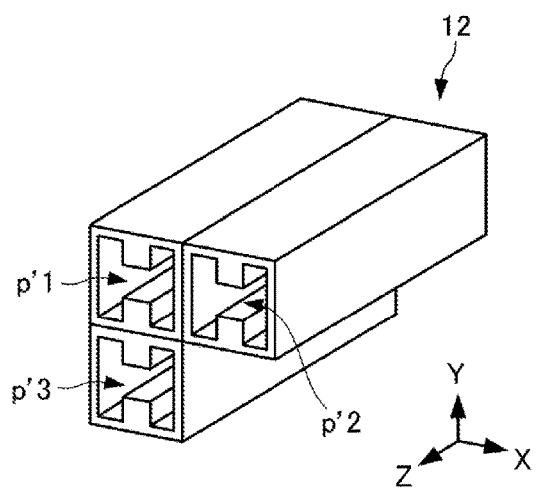
FIGS. 11A to 11C are graphs (first parts) illustrating simulation results of the reflection characteristics and isolations of the horn antenna of the antenna measurement system according to the first embodiment.

As shown in FIG. 11A, the plurality of probe antennas 12 are formed by tightly attaching the outer walls of individual double-ridge waveguide p'1 to p'3. Alternatively, three double-ridge waveguides p'1 to p'3 may be formed internally with each other.

Figure 11B:
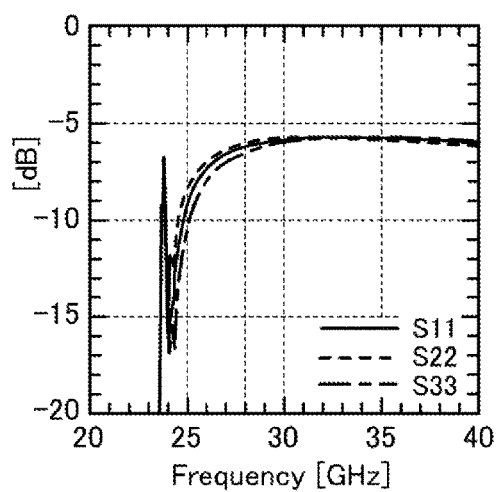

FIG. 11B is a graph illustrating simulation results of reflection characteristics which are obtained by the three double-ridge waveguides p'1 to p'3 shown in FIG. 11A. Here, S11 indicates the reflection characteristics of the double-ridge waveguide p'1, S22 indicates the reflection characteristics of the double-ridge waveguide p'2, and S33 indicates the reflection characteristics of the double-ridge waveguide p'3.

Figure 11C:
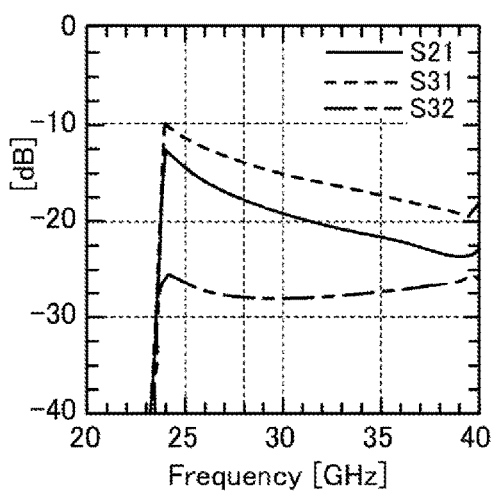

FIG. 11C is a graph illustrating simulation results of isolations which are obtained by the three double-ridge waveguides p'1 to p'3 shown in FIG. 11A. Here, S21 indicates an isolation between the probe antennas p'1 and p'2, S31 indicates an isolation between the double-ridge waveguides p'1 and p'3, and S32 indicates an isolation between the double-ridge waveguides p'2 and p'3.

FIG. 12A shows an example in which the plurality of probe antennas 12 are configured by the integral formation of three double-ridge waveguides p'1 to p'3.

As shown in FIG. 12B, a wall portion 12w that partitions two double-ridge waveguides p'1 and p'2 adjacent to each other is provided with a slit 12s having a predetermined length 1p from a aperture plane 12p side of the double-ridge waveguides p'1 to p'3 along the longitudinal direction (Z direction) of the transmission line 31 (see FIGS. 2A and 2B). Similarly, the wall portion 12w that partitions two double-ridge waveguides p'1 and p'3 adjacent to each other is also provided with the slit 12s. The slit 12s may have a rectangular shape as shown in FIGS. 12A to 12D, and may have a wedge shape as shown in FIGS. 9A and 9B.

FIG. 12C is a graph illustrating simulation results of reflection characteristics which are obtained by the three double-ridge waveguides p'1 to p'3 shown in FIG. 12A. In addition, FIG. 12D is a graph illustrating simulation results of an isolation which is obtained by the three double-ridge waveguides p'1 to p'3 shown in FIG. 12A.

That is, as compared with the configurations of FIGS. 11A to 11C having no slit 12s, in the configurations of FIGS. 12A to 12D having the slit 12s, it can be understood that reflection characteristics of a high-frequency region of approximately 28 GHz or higher are improved, and the receiving sensitivity of the three double-ridge waveguides p'1 to p'3 becomes satisfactory. In addition, in the configurations of FIGS. 12A to 12D having the slit 12s, it can also be understood that the isolation between the three double-ridge waveguides p'1 to p'3 is improved in a high-frequency region of approximately 25 GHz or higher. Further, optimizing the length 1p of the slit 12s makes it possible to obtain a higher isolation improvement effect.

Figure 13:
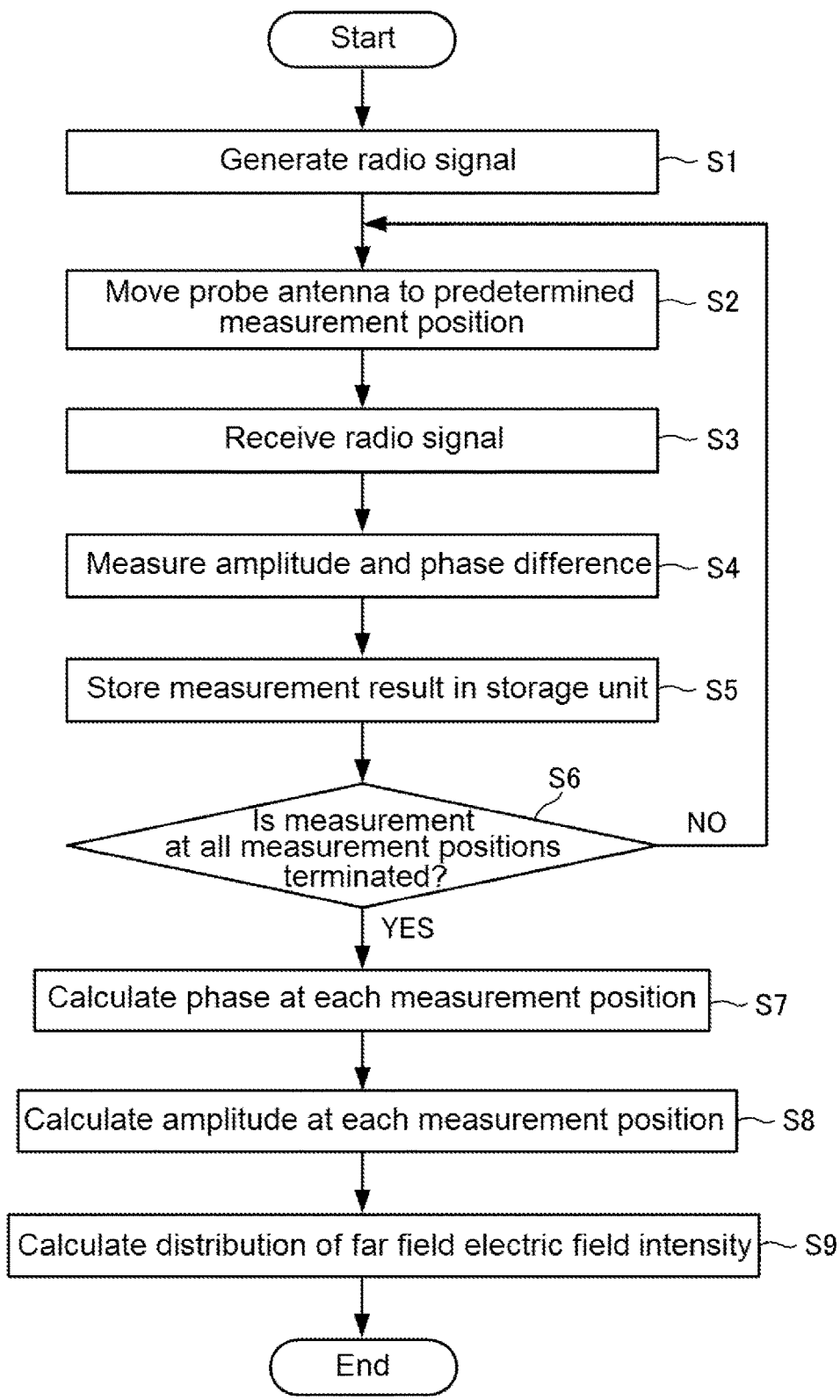
FIG. 13 is a flow diagram illustrating a process of an antenna measurement method using the antenna measurement system according to the first embodiment.

Hereinafter, an antenna measurement method using the antenna measurement system 1 of the present embodiment will be described with reference to a flow diagram of FIG. 13.

First, the antenna 100 to be measured generates a radio signal (step S1).

Next, the scanning control unit 14 causes the probe scanning mechanism 13 to move the plurality of probe antennas 12 to measurement positions within the measurement plane P while maintain the relative positions thereof (probe scanning step S2).

Next, the plurality of probe antennas 12 receive the radio signal, output from the antenna 100 to be measured, in the near field region at the measurement positions moved in step S2 (step S3).

Next, the amplitude and phase difference measurement unit 16 measures a phase difference between the radio signals received by two of the plurality of probe antennas which are adjacent to each other. In addition, the amplitude and phase difference measurement unit 16 measures the amplitudes of the radio signals received by the plurality of probe antennas 12 (amplitude and phase difference measuring step S4).

Next, the storage unit 17 stores the phase difference and amplitude measured in step S4 in association with the measurement positions at which the phase difference and amplitude are measured (step S5).

Next, the control unit 22 determines whether values of the phase difference and amplitude are obtained with respect to all the measurement positions within the measurement plane P (step S6). In a case of negative determination, the process returns to step S2. In a case of positive determination, the process proceeds to phase calculation step S7.

In step S7, the phase calculation unit 18 calculates the phase of the radio signal at each measurement position from the phase difference measured in step S4. Further, the phase calculation unit 18 outputs the calculated phase at each measurement position, as phase information, to the far field directivity calculation unit 20.

Meanwhile, in a case where the antenna measurement system 1 includes the phase difference averaging unit 23, in step S7, the phase calculation unit 18 causes the phase difference averaging unit 23 to average a plurality of phase differences at two measurement positions adjacent to each other measured in step S4. Further, the phase calculation unit 18 calculates the phase of the radio signal at each measurement position from the averaged phase difference, and outputs the calculated phase, as phase information, to the far field directivity calculation unit 20. Meanwhile, in step S7, an averaging process performed by this phase difference averaging unit 23 can be omitted.

Next, in a case where the antenna measurement system 1 includes the amplitude averaging unit 19, the amplitude averaging unit 19 outputs a value obtained by averaging a plurality of amplitudes measured in step S4 at the respective measurement positions, as amplitude information, to the far field directivity calculation unit 20 (step S8). Meanwhile, an averaging process in this step S8 can be omitted.

Next, the far field directivity calculation unit 20 calculates the distribution of far field electric field intensity, using the coordinate information, the phase information, and the amplitude information relating to all the measurement positions (step S9).

As described above, the antenna measurement system 1 according to the present embodiment can measure phases and amplitudes in a near field, without supplying a reference signal of the antenna 100 to be measured to the radio signal transmitted from the antenna 100 to be measured which is integrated with an RF circuit.

In addition, in the antenna measurement system 1 according to the present embodiment, the plurality of probe antennas 12 are scanned so as to include at least one of measurement positions at which amplitudes and phase differences have already been measured by the amplitude and phase difference measurement unit 16, and measurement position at which amplitudes and phase differences have not yet been measured, and thus it is possible to calculate phases at all the measurement positions at which amplitudes and phase differences are measured.

In addition, in the antenna measurement system 1 according to the present embodiment, the radio signal transmitted from the antenna 100 to be measured which is integrated with an RF circuit is measured using a near field measurement, and thus it is possible to calculate the distribution of far field electric field intensity.

In addition, in the antenna measurement system 1 according to the present embodiment, with a configuration in which the plurality of probe antennas 12 are symmetrically disposed, it is possible to calculate a phase by offsetting influences due to mutual coupling between the probe antennas 12 adjacent to each other, in the process of the phase calculation unit 18 or the amplitude averaging unit 19.

In addition, in the antenna measurement system 1 according to the present embodiment, the phase difference between the radio signals received by the central probe antenna p1 and the left probe antenna p2 and the phase difference between the radio signals received by the central probe antenna p1 and the right probe antenna p3 are averaged in two measurement positions adjacent to each other, and thus it is possible to calculate phases by offsetting errors because a measurement error of the phase difference between the central probe antenna and the left probe antenna and a measurement error of the phase difference between the central probe antenna and the right probe antenna have reverse polarities, and to obtain the distribution of phases with a higher degree of accuracy. In addition, in the antenna measurement system 1 according to the present embodiment, the same phase averaging is also performed on the upper probe antenna p4 and the lower probe antenna p5, and thus it is possible to obtain the distribution of phases with a high degree of accuracy.

In addition, in the antenna measurement system 1 according to the present embodiment, it is possible to propagate electromagnetic waves of an equal frequency range in a cross-sectional shape smaller than the cross-sectional shape of the transmission line 30 of the standard square waveguide by using the double-ridge waveguide, and thus it is easy to adjacent dispose the plurality of probe antennas 12 at a distance equal to or less than ½ wavelength (0.5λ) of the radio signal.

In addition, in the antenna measurement system 1 according to the present embodiment, the wall portion 12w that partitions two double-ridge waveguides adjacent to each other is provided with the slit 12s, and thus an isolation between the two double-ridge waveguides adjacent to each other is improved, that is, coupling therebetween is reduced. In addition, reflection in each double-ridge waveguide aperture is reduced, and the receiving sensitivity thereof is improved.

In addition, it is possible to use a non-modulated wave signal, a multicarrier signal (for example, OFDM signal) or the like, as the radio signal transmitted from the antenna 100 to be measured, during the measurement of the distribution of electric field intensity which is performed by the antenna measurement system 1 according to the present embodiment. In this case, a spectrum analyzer is used in the amplitude and phase difference measurement unit 16, it is possible to measure the phase and amplitude of a wide-band radio signal in a short period of time, and to calculate the distribution of wide-band electric field intensity at a fast rate.

Second Embodiment

Subsequently, an antenna measurement system 2 according to a second embodiment of the present invention will be described with reference to the accompanying drawings. The same components as those of the antenna measurement system 1 according to the first embodiment are denoted by the same reference numerals and signs, and thus the detailed description thereof will not be given.

Figure 14:
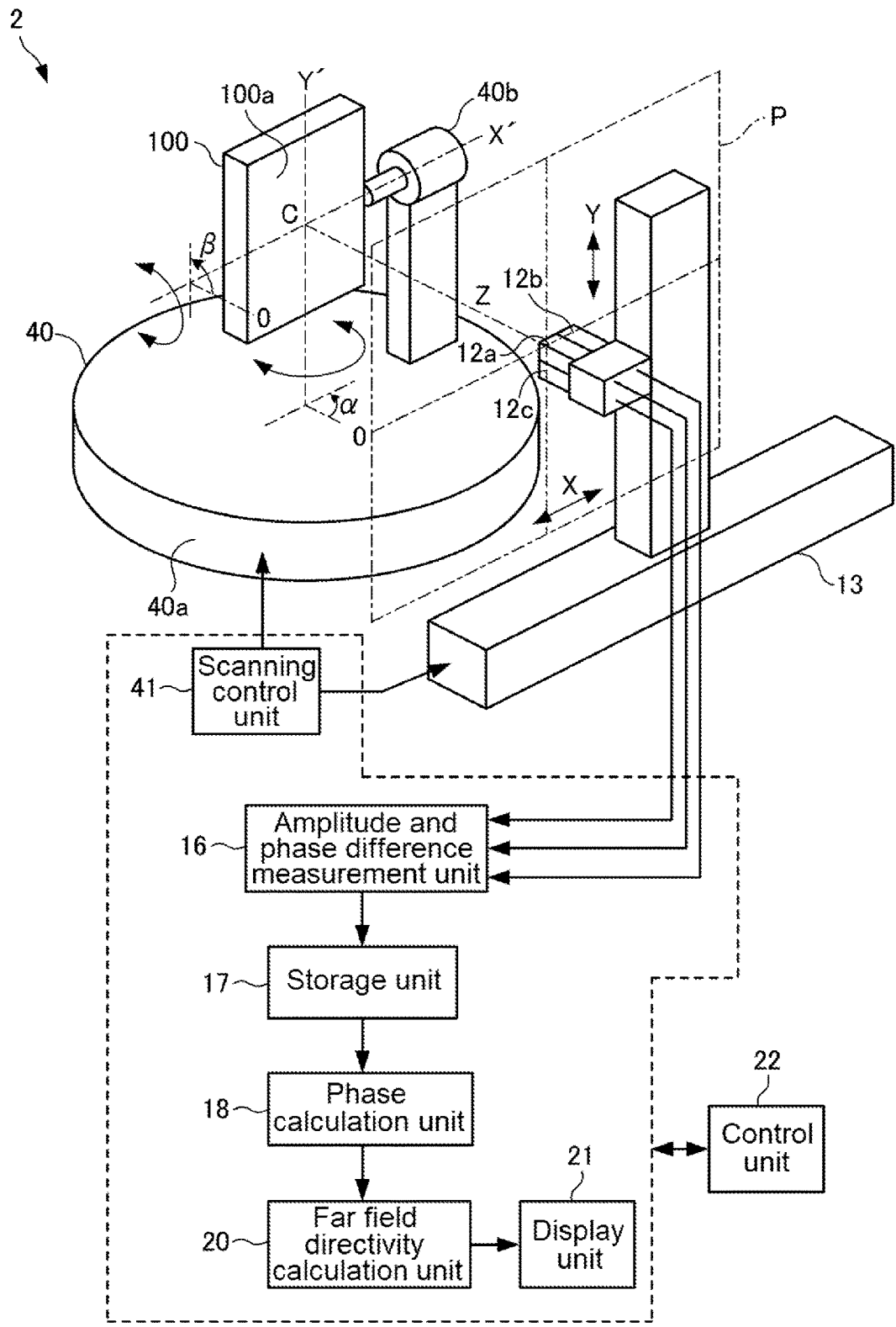
FIG. 14 is a configuration diagram of an antenna measurement system according to a second embodiment.
Figure 15:
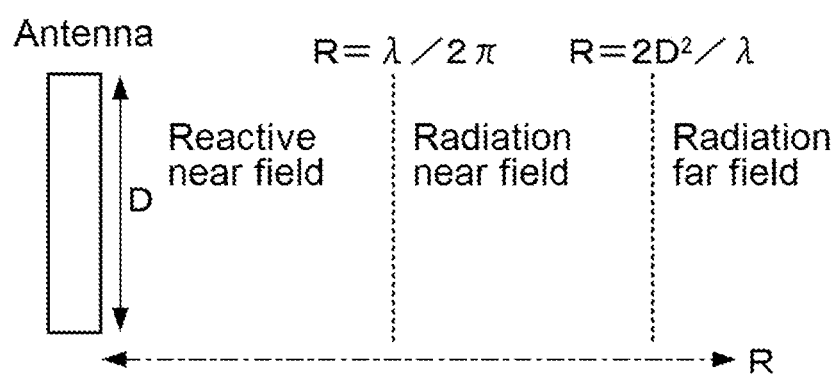
FIG. 15 is a diagram illustrating a measurement region of an antenna.
Figure 16:
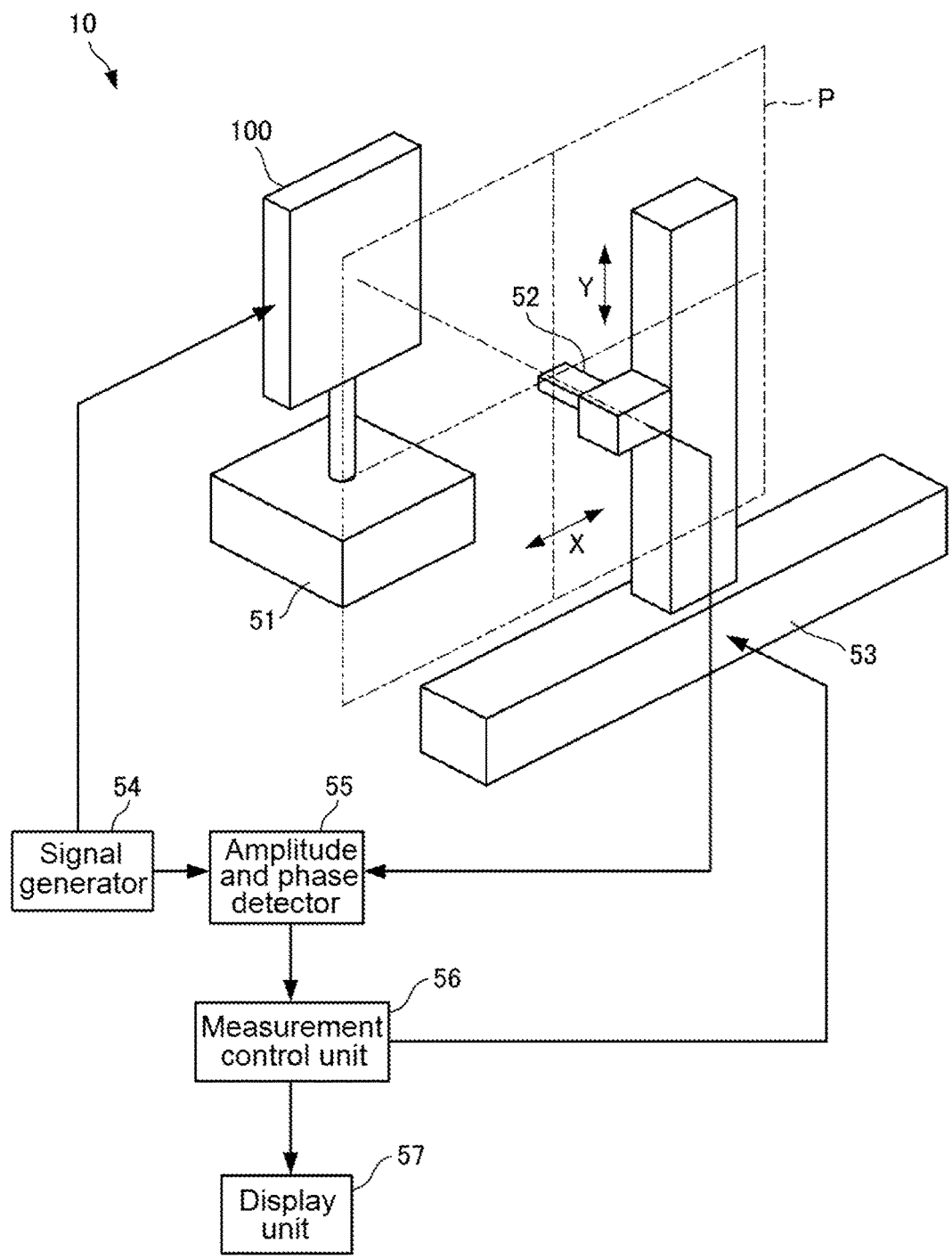
FIG. 16 is a configuration diagram of an antenna measurement system of the related art.

The antenna measurement system 2 of the present embodiment includes an antenna support 40 and a scanning control unit 41 which are components shown in FIG. 14, instead of the antenna support 11 and the scanning control unit 14 in the first embodiment.

The antenna support 40 supports the antenna 100 to be measured so that a direction in which its electromagnetic wave radiation plane 100a (aperture plane of an antenna) directly faces a measurement plane P is set to a reference direction, and that the electromagnetic wave radiation plane 100a can change to a state of being inclined with respect to the measurement plane P from the reference direction. Meanwhile, the reference direction herein refers to a state where the electromagnetic wave radiation plane 100a of the antenna 100 to be measured faces the measurement plane P in parallel, and a Z-axis which is orthogonal to an X-axis and a Y-axis at the origin position of the measurement plane P passes through a central position C of the electromagnetic wave radiation plane 100a.

For example, as shown in FIG. 14, the antenna support 40 includes an azimuth change mechanism portion 40a that rotates around a Y'-axis passing through the central position C of the electromagnetic wave radiation plane 100a of the antenna 100 to be measured in parallel to the Y-axis of the measurement plane P, and an elevation angle change mechanism portion 40b, fixed onto the azimuth change mechanism portion 40a, which supports the antenna 100 to be measured on the rotational axis of the azimuth change mechanism portion 40a and rotates the antenna 100 to be measured around an X'-axis passing through the central position C of the electromagnetic wave radiation plane 100a of the antenna 100 to be measured in parallel to the X-axis of the measurement plane P.

The azimuth angle of 0° (reference angle) of the antenna 100 to be measured based on the azimuth change mechanism portion 40a is a direction parallel to the Z-axis, and the azimuth angle can be changed to any angle α around the Y'-axis on the basis of this direction. Similarly, the elevation angle of 0° (reference angle) of the antenna 100 to be measured based on the elevation angle change mechanism portion 40b is also a direction parallel to the Z-axis, and the elevation angle can be changed to any angle β around the X'-axis on the basis of this direction.

As is the case with the first embodiment, the scanning control unit 41 is configured to control the probe scanning mechanism 13, and to control the azimuth change mechanism portion 40a and the elevation angle change mechanism portion 40b of the antenna support 40.

As described above, in the antenna measurement system 2 according to the present embodiment, even in a case where a beam direction when the antenna 100 to be measured is directed toward the reference direction is away from the center of the measurement plane P, it is possible to obtain a directivity in the measurement plane P having a minimum size by rotating the antenna 100 to be measured.

DESCRIPTION OF REFERENCE NUMERALS AND SIGNS 1, 2: antenna measurement system
11, 40: antenna support
12, 12a, 12b, 12c, p'1 to p'3: probe antenna
p1: central probe antenna
p2: left probe antenna
p3: right probe antenna
p4: upper probe antenna
p5: lower probe antenna
12p: aperture plane
12s: slit
12w: wall portion
13: probe scanning mechanism
14, 41: scanning control unit
15: changeover switch
16: amplitude and phase difference measurement unit
17: storage unit
18: phase calculation unit
19: amplitude averaging unit
20: far field directivity calculation unit
21: display unit
22: control unit
23: phase difference averaging unit
30, 31: transmission line
31a: central portion
31b, 31c: both side portions
40a: azimuth change mechanism portion
40b: elevation angle change mechanism portion
100: antenna to be measured
100a: electromagnetic wave radiation plane

What is claimed is:

1. An antenna measurement system that measures an amplitude and a phase of each radio signal transmitted from an antenna to be measured, in a near field, the system comprising:
    a plurality of probe antennas that receive the radio signals at some of a plurality of measurement positions located within a predetermined measurement plane of a near field region of the antenna to be measured;
    a probe scanning mechanism that moves the plurality of probe antennas to the plurality of measurement positions;
    an amplitude and phase difference measurement unit that measures a phase difference between the radio signals received by the plurality of probe antennas, and measures an amplitude of each of the radio signals received by the plurality of probe antennas, every time each of the probe antennas is moved to the measurement position by the probe scanning mechanism; and
    a phase calculation unit that calculates a phase of the radio signal at each of the measurement positions from the phase difference measured by the amplitude and phase difference measurement unit.

2. The antenna measurement system according to claim 1, wherein the antenna to be measured is configured to have an RF circuit integrated therewith, and
    the plurality of probe antennas are moved while maintaining relative positions therebetween.

3. The antenna measurement system according to claim 2, further comprising a far field directivity calculation unit that calculates a distribution of far field electric field intensity, using information of the amplitude measured by the amplitude and phase difference measurement unit and information of the phase calculated by the phase calculation unit.

4. The antenna measurement system according to claim 3, wherein the plurality of probe antennas are disposed simultaneously at four or more measurement positions by the probe scanning mechanism, and are disposed so as to be line-symmetric with respect to a straight line that links any two measurement positions out of the four or more measurement positions, and the two measurement positions are adjacent to each other.

5. The antenna measurement system according to claim 3, wherein the plurality of probe antennas include a central probe antenna, a left probe antenna and a right probe antenna which are symmetrically disposed in a horizontal direction of the measurement plane, centering on the central probe antenna, and an upper probe antenna and a lower probe antenna which are symmetrically disposed in a vertical direction of the measurement plane, centering on the central probe antenna, and the phase calculation unit includes a phase difference averaging unit that averages a plurality of phase differences measured by the amplitude and phase difference measurement unit at two measurement positions adjacent to each other, and calculates a phase of the radio signal at each of the measurement positions from the phase difference averaged by the phase difference averaging unit.

6. The antenna measurement system according to claim 3, wherein at least one of the plurality of probe antennas is a double-ridge waveguide which includes a transmission line for propagating electromagnetic waves of a predetermined frequency range, and in which a cross-sectional shape of the transmission line is configured such that a central portion thereof is smaller in height than both side portions thereof.

7. The antenna measurement system according to claim 3, wherein aperture shapes of the plurality of probe antennas are the same as each other.

8. The antenna measurement system according to claim 3, further comprising an antenna support that supports the antenna to be measured, wherein the antenna support is configured such that a direction in which an electromagnetic wave radiation plane of the antenna to be measured directly faces the measurement plane is a reference direction, and that a direction of the electromagnetic wave radiation plane is capable of being changed from the reference direction.

9. The antenna measurement system according to claim 2, wherein the plurality of probe antennas are disposed simultaneously at four or more measurement positions by the probe scanning mechanism, and are disposed so as to be line-symmetric with respect to a straight line that links any two measurement positions out of the four or more measurement positions, and the two measurement positions which are adjacent to each other.

10. The antenna measurement system according to claim 9, wherein at least one of the plurality of probe antennas is a double-ridge waveguide which includes a transmission line for propagating electromagnetic waves of a predetermined frequency range, and in which a cross-sectional shape of the transmission line is configured such that a central portion thereof is smaller in height than both side portions thereof.

11. The antenna measurement system according to claim 9, wherein aperture shapes of the plurality of probe antennas are the same as each other.

12. The antenna measurement system according to claim 9, further comprising an antenna support that supports the antenna to be measured, wherein the antenna support is configured such that a direction in which an electromagnetic wave radiation plane of the antenna to be measured directly faces the measurement plane is a reference direction, and that a direction of the electromagnetic wave radiation plane is capable of being changed from the reference direction.

13. The antenna measurement system according to claim 2, wherein the plurality of probe antennas include a central probe antenna, a left probe antenna and a right probe antenna which are symmetrically disposed in a horizontal direction of the measurement plane, centering on the central probe antenna, and an upper probe antenna and a lower probe antenna which are symmetrically disposed in a vertical direction of the measurement plane, centering on the central probe antenna, and the phase calculation unit includes a phase difference averaging unit that averages a plurality of phase differences measured by the amplitude and phase difference measurement unit at two measurement positions adjacent to each other, and calculates a phase of the radio signal at each of the measurement positions from the phase difference averaged by the phase difference averaging unit.

14. The antenna measurement system according to claim 13, wherein at least one of the plurality of probe antennas is a double-ridge waveguide which includes a transmission line for propagating electromagnetic waves of a predetermined frequency range, and in which a cross-sectional shape of the transmission line is configured such that a central portion thereof is smaller in height than both side portions thereof.

15. The antenna measurement system according to claim 13, wherein aperture shapes of the plurality of probe antennas are the same as each other.

16. The antenna measurement system according to claim 2, wherein at least one of the plurality of probe antennas is a double-ridge waveguide which includes a transmission line for propagating electromagnetic waves of a predetermined frequency range, and in which a cross-sectional shape of the transmission line is configured such that a central portion thereof is smaller in height than both side portions thereof.

17. The antenna measurement system according to claim 16, wherein at least two of the plurality of probe antennas which are adjacent to each other are the double-ridge waveguide, and a wall portion that partitions the two double-ridge waveguides adjacent to each other is provided with a slit having a predetermined length from an aperture plane side of the double-ridge waveguide along a longitudinal direction of the transmission line.

18. The antenna measurement system according to claim 2, wherein aperture shapes of the plurality of probe antennas are the same as each other.

19. The antenna measurement system according to claim 2, further comprising an antenna support that supports the antenna to be measured, wherein the antenna support is configured such that a direction in which an electromagnetic wave radiation plane of the antenna to be measured directly faces the measurement plane is a reference direction, and that a direction of the electromagnetic wave radiation plane is capable of being changed from the reference direction.

20. An antenna measurement method using the antenna measurement system according to claim 1, the method comprising:

a probe scanning step of moving each of the probe antennas to each of a plurality of measurement positions;

an amplitude and phase difference measuring step of measuring a phase difference between the radio signals received by the plurality of probe antennas, and measuring an amplitude of each of the radio signals received by the plurality of probe antennas, every time each of the probe antennas is scanned at the measurement position; and a phase calculation step of calculating a phase of the radio signal at each of the measurement positions from the phase difference measured in the amplitude and phase difference measuring step.

* * * * *